United States Patent [19]

Hoshino

[11] Patent Number: 4,916,396
[45] Date of Patent: Apr. 10, 1990

[54] MAGNETIC RESONANCE IMAGING METHOD

[75] Inventor: Kazuya Hoshino, Tokyo, Japan

[73] Assignee: Yokogawa Medical Systems, Limited, Tokyo, Japan

[21] Appl. No.: 254,679

[22] PCT Filed: Dec. 12, 1986

[86] PCT No.: PCT/JP86/00631

§ 371 Date: Jun. 1, 1988

§ 102(e) Date: Jun. 1, 1988

[87] PCT Pub. No.: WO87/03464

PCT Pub. Date: Jun. 18, 1987

[30] Foreign Application Priority Data

Dec. 16, 1985 [JP] Japan ............................ 60-282610

[51] Int. Cl.$^4$ .......................................... G01R 33/20
[52] U.S. Cl. ...................................... 324/309; 324/312
[58] Field of Search ............... 324/309, 312, 307, 309, 324/300, 310, 311, 314, 313

[56] References Cited

U.S. PATENT DOCUMENTS

4,727,325  2/1988  Matsui et al. .................... 324/312
4,746,864  5/1988  Satoh .............................. 324/309
4,748,410  3/1988  Macovski ........................ 324/309
4,786,872  11/1988  Hoshino ......................... 324/312

Primary Examiner—Michael J. Tokar
Attorney, Agent, or Firm—Moonray Kojima

[57] ABSTRACT

There is disclosed a magnetic resonance imaging method which permits a scan to be made in a short time by collecting only the data that is used to reconstruct an image. The method is initiated by defining a circular region whose center lies at the point in a two-dimensional Fourier plane at which the spatial frequency is zero. The Fourier plane corresponds to a region containing an image to be reconstructed. The spin echo signals emanating from a region inside the circular region are observed by an ordinary Fourier method, said region having a length greater than a predetermined length as measured in the direction in which data obtained by the observation is read out. The spin echo signals emanating from the remaining region inside the circular region are observed while shortening the time for which a reading gradient magnetic field is applied whenever an excitation is effected and, at the same time, effecting an additional phase shift encoding.

4 Claims, 7 Drawing Sheets

MAGNETIC RESONANCE IMAGING METHOD

TECHNICAL FIELD

The present invention relates to an improved MRI (magnetic resonance imaging) method and, more particularly, to an MRI method by which a scan is made in a short time in collecting data by Fourier transform.

BACKGROUND ART

An MRI (magnetic resonance imaging) instrument comprises a magnet portion, a transmitting-and-receiving portion for applying RF pulses or RF electromagnetic radiation to an object under examination placed in the magnetic field produced by the magnet portion and for detecting the NMR signal from the object, and a control-and-image processing portion which controls the operation of the transmitting-and-receiving portion and the operation of the magnet portion and processes the obtained data to image the object. The magnet portion consists of static magnetic field coils for generating a uniform and static magnetic field $H_0$ and gradient magnetic field coils for setting up magnetic fields which are parallel with the static magnetic field $H_0$ and have linear gradients in the directions of the x, y, z axes, respectively.

Figure 9A:
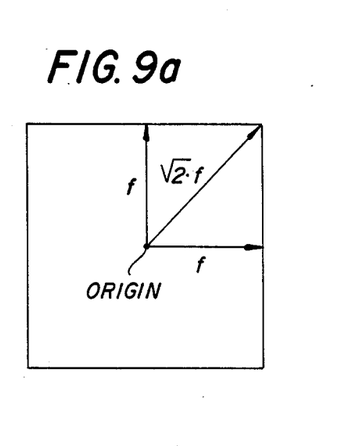
FIGS. 9a and 9b are diagrams for illustrating a region from which data is collected by an MRI instrument.

The control-and-image processing portion of the MRI instrument constructed as described above produces a pulse sequence by saturation recovery or repetitive inversion recovery method. Data is collected by making use of Fourier transform, and an image is reconstructed. At this time, data is collected from a square or rectangular region in a two-dimensional Fourier plane as shown in FIG. 9(a), by scanning it. When Fourier transform is employed, data concerning the nuclear spin density of the object is directly obtained by two-dimensional Fourier transform.

Figure 9B:
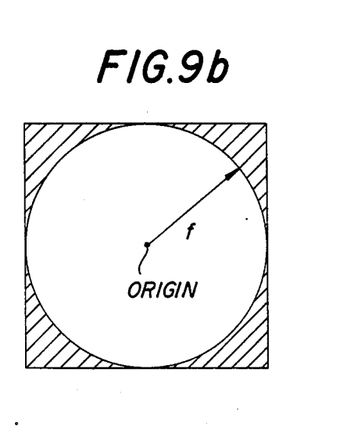

In FIG. 9(a), as the distance from the origin O increases, the spatial frequency increases. Let f be the highest spatial frequency in the horizontal and vertical directions. The highest spatial frequency in the diagonal direction is $2^{\frac{1}{2}} \cdot f$. Therefore, the resolution differs from direction to direction. Consequently, the obtained image becomes nonuniform in a peculiar way. The resolution in the diagonal direction is excessively high at the sacrifice of signal to noise ratio. In order to reconstruct an image free of these problems, a circular window function is applied to the data region as shown in FIG. 9(b). Specifically, the data contained in the hatched portion is discarded, and only the data contained in the circle is used.

In the conventional MRI instrument, a circular window function is applied to the data region to reconstruct an image. Therefore, even the data not used for the reconstruction is collected. This results in a useless operation during a scan.

DISCLOSURE OF THE INVENTION

It is an object of the invention to provide an MRI method which permits a scan to be made in a short time by collecting only the data that is used to reconstruct an image.

An MRI method according to the invention comprises the steps of: defining a circular region whose center lies at the point in a two-dimensional Fourier plane at which the spatial frequency is zero, the Fourier plane corresponding to a region containing an image to be reconstructed; observing the spin echo signals emanating from a region inside the circular region by an ordinary Fourier method, said region having a length greater than a predetermined length as measured in the direction in which data obtained by the observation is read out; and observing the spin echo signals emanating from the remaining region inside the circular region while shortening the time for which a reading gradient magnetic field is applied whenever an excitation is effected and, at the same time, effecting an additional phase shift encoding.

BEST MODE FOR CARRYING OUT THE INVENTION

The present invention is hereinafter described in detail by referring to the drawings.

Figure 1:
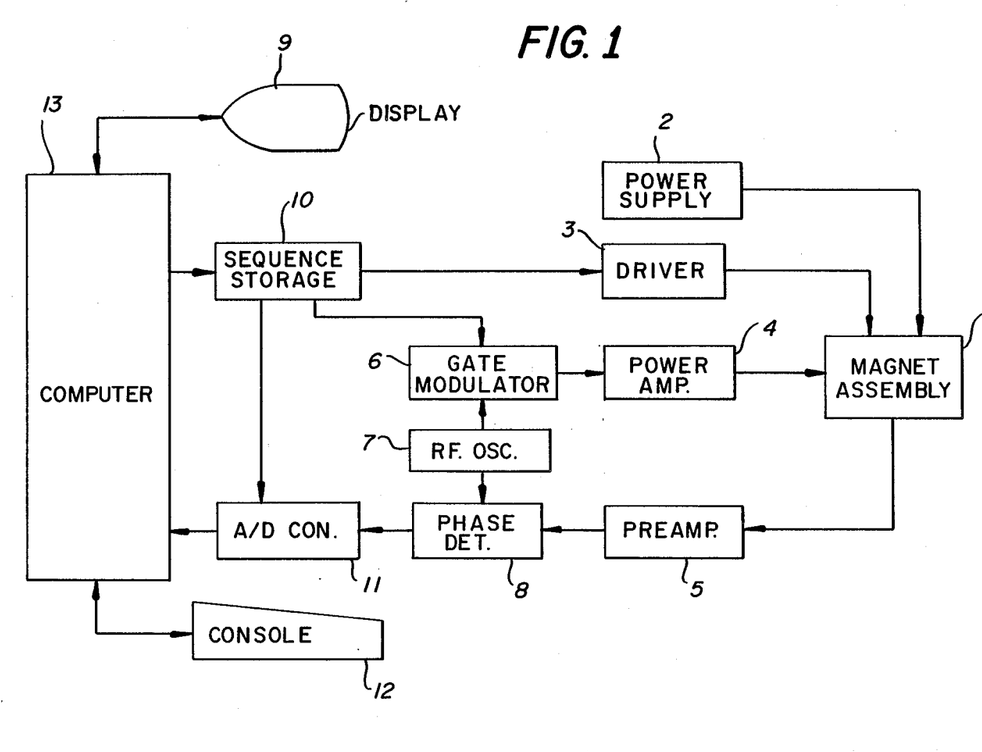
FIG. 1 is a block diagram of an MRI, instrument according to the invention.

FIG. 1 is a block diagram of an MRI (magnetic resonance imaging) instrument according to the invention. This instrument has a magnet assembly 1 which has a structure commonly adopted in the technical field of MRI. The assembly 1 has a space or hole in which an object under examination is inserted. Mounted around this space are static magnetic field coils for applying a certain static magnetic field to the object, gradient magnetic field coils for producing gradient magnetic fields, an RF transmitter coil for producing RF pulses to excite the spins of the atomic nuclei in the object, a pickup coil for detecting the NMR signal from the object, and other components. The gradient magnetic field coils produce gradient magnetic fields in the directions of the x, y, and z axes. The static magnetic field coils, the gradient magnetic field coils, the RF transmitter coil, and the NMR signal pickup coil are connected to a main magnetic field power supply 2, a gradient magnetic field driver circuit 3, an RF power amplifier 4, and a preamplifier 5, respectively. A sequence storage circuit 10 causes data acquisition to be effected in such a way that an image is reconstructed with isotropic resolution in accordance with the instruction issued by a computer 13. That is, data is collected from a circular region whose center lies at the point in a two-dimensional Fourier plane at which the spatial frequency is zero. The storage circuit 10 has a means for making a scan with a pulse sequence which is switched to another pulse sequence according to the period of time for which data is collected. The storage circuit 10 further includes a means for controlling the instant at which the detected NMR signal is converted into digital form. The storage circuit 10 controls the operation of the gradient magnetic field driver circuit 3, a gate modulating circuit 6, and an analog-to-digital converter 11. The gate modulating circuit 6 modulates the RF signal supplied from an RF oscillator circuit 7 in response to the timing signal fed from the sequence storage circuit 10. The modulated signal is furnished to the RF power amplifier 4. The NMR signal produced from the pickup coil is fed via the preamplifier 5 to a phase-sensitive detector 8, which produces an output signal related to the phase difference between its input signal and a reference signal, or the output signal from the RF oscillator circuit 7. The output from the phase-sensitive detector 8 is applied to the analog-to-digital converter 11, which converts its input analog signal into digital form and supplies it to the computer 13. Signals are transmitted between the computer 13 and a console 12. The computer 13 realizes various pulse sequences in scanning the object. For these purposes, the computer 13 switches the mode of operation of the sequence storage circuit 10 to another mode of operation and rewrites the contents of the storage circuit 10. Also, the computer 13 performs arithmetic operations to reconstruct an image, using the data delivered from the A/D converter 11. The reconstructed image is displayed on a display device 9.

Figure 2:
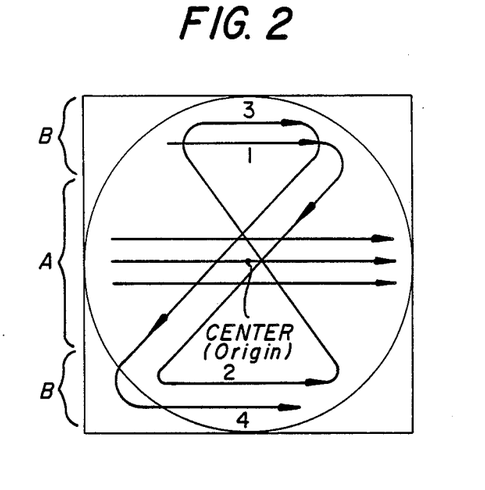
FIGS. 2-4 are diagrams for illustrating the operation of the instrument shown in FIG. 1.
Figure 3:
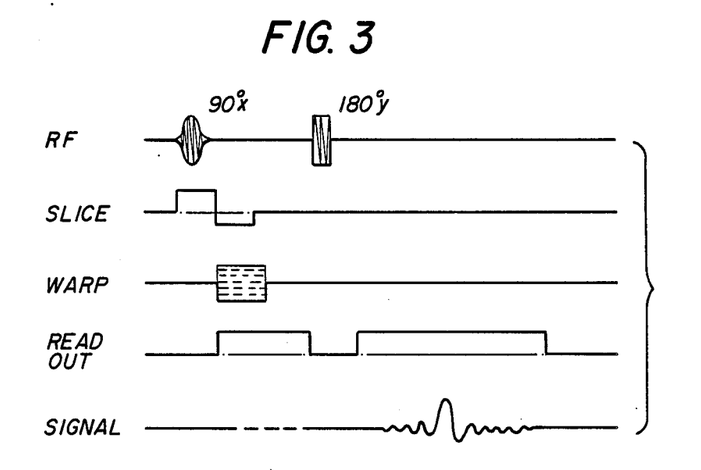
Figure 4:
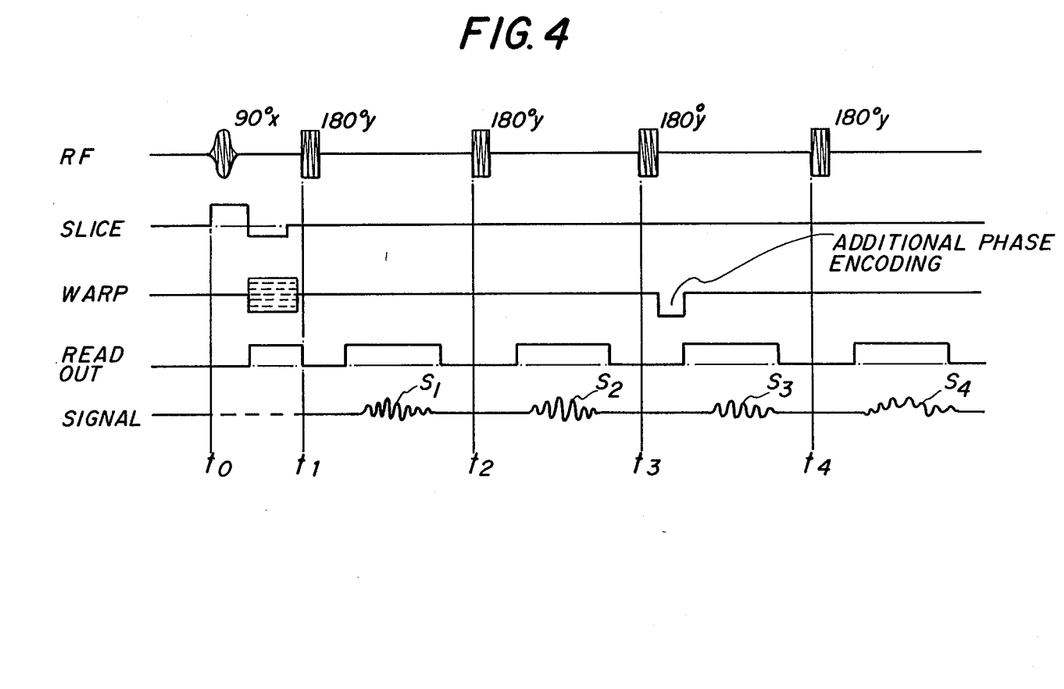

The MRI instrument constructed as described above is operated by the method according to the invention in the manner described below. The sequence storage circuit 10 collects data from a region encircled by a circle in a two-dimensional Fourier plane, as shown in FIG. 2. The center of the circle lies at the point at which the spatial frequency is zero. The pulse sequence used to scan a region A that needs a long data acquisition time differs from the pulse sequence used to scan a region B that requires a short data acquisition time. More specifically, an ordinary Fourier pulse sequence as shown in FIG. 3 is used for the region A that necessitates a long data acquisition time. When the region B that needs a short data acquisition time is scanned, a pulse sequence as shown in FIG. 4 is employed. One of these two sequences is switched to another at the boundary between the regions A and B, and this boundary can be selected at will.

FIG. 3 is a waveform diagram of a known pulse sequence which is used to collect data by Fourier transform. Under a homogeneous static magnetic field $H_0$, a $90_x°$ pulse, or exciting pulse, is applied while applying a slice gradient. As a result, only the spins existing in a certain sliced plane across the object under examination are excited. Then, a rephase gradient for removing the phase shift of the spins caused by the slice gradient is applied. A dephase gradient for producing spin echo signals and a warp gradient are applied. Thereafter, all the gradients are caused to cease, and a $180_y°$ pulse, or inverse pulse, is applied to inverse the spins. Subsequently, readout gradients are applied to obtain the aforementioned spin echo signals. The spin echo signals correspond to one line of two-dimensional Fourier transform of the spin distribution of the object under examination. The position of this line is determined by the product of the magnitude of a warp gradient and the time for which the warp gradient magnetic field is applied. Then, the aforementioned sequence is repeated with different warp gradients to collect the data necessary to reconstruct an image from the preselected region A. Scans are made in the direction indicated by the solid arrows in FIG. 2.

When the region B is scanned, the sequence is switched to the sequence shown in FIG. 4. The sequence storage circuit 10 applies a $90_x°$ pulse while applying a slice gradient at instant $t_0$ to excite only those spins which exist in a certain sliced plane across the object. Then, a warp gradient, rephase gradients, and dephase gradients are applied in the same manner as the scheme illustrated in FIG. 3. Subsequently, $180_y°$ pulses are applied at instants $t_1$, $t_2$, $t_3$, $t_4$, etc. After $180_y°$ pulse is applied at instant $t_3$, an additional phase encoding, or additional warp, is applied. This application of additional phase encoding can be made while an observation is being made. The application of the $180_y°$ pulses reverses the sign of the phase encoding. The additional phase encoding changes the value of the phase shift encoding. As a result, the observed data line varies as indicated by (1), (2), (3), (4) in FIG. 2. Spin echo signals $S_1$, $S_2$, $S_3$, $S_4$, etc. obtained after the application of the $180_y°$ pulses are collected during the application of reading gradients. The periods for which the echo signals $S_1$, $S_2$, $S_3$, $S_4$ persist, or the lengths of the data lines (1)–(4), are determined by controlling the time for which the reading gradients are applied, according to the circular region. In this way, each time the object is excited, a plurality of lines of data are collected and so the time taken to make a scan can be shortened. The collected data is processed in the same manner as in the case where data is obtained by ordinary Fourier transform, in order to reconstruct an image.

Figure 5:
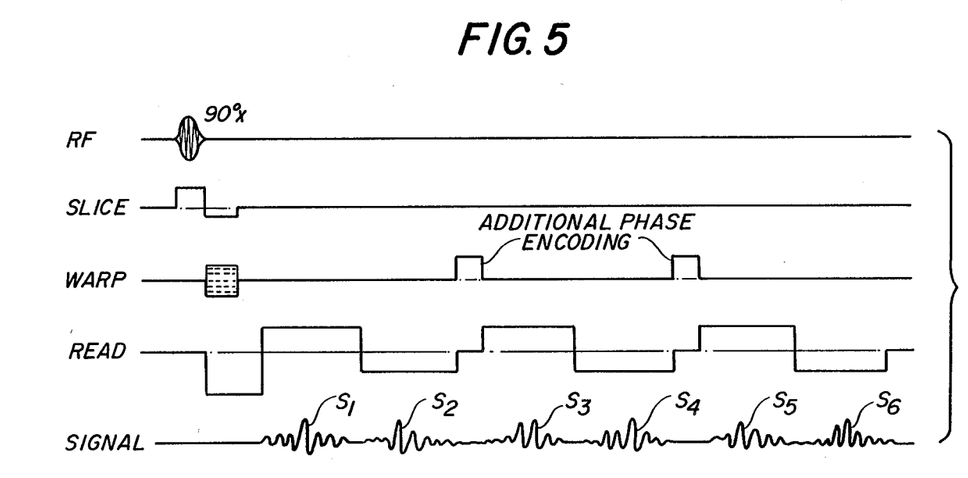
FIGS. 5 and 6 are diagrams for illustrating the operation of another instrument according to the invention.
Figure 6:
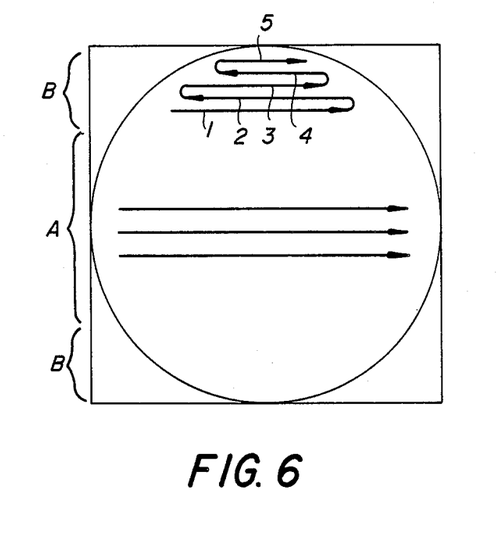
Figure 7:
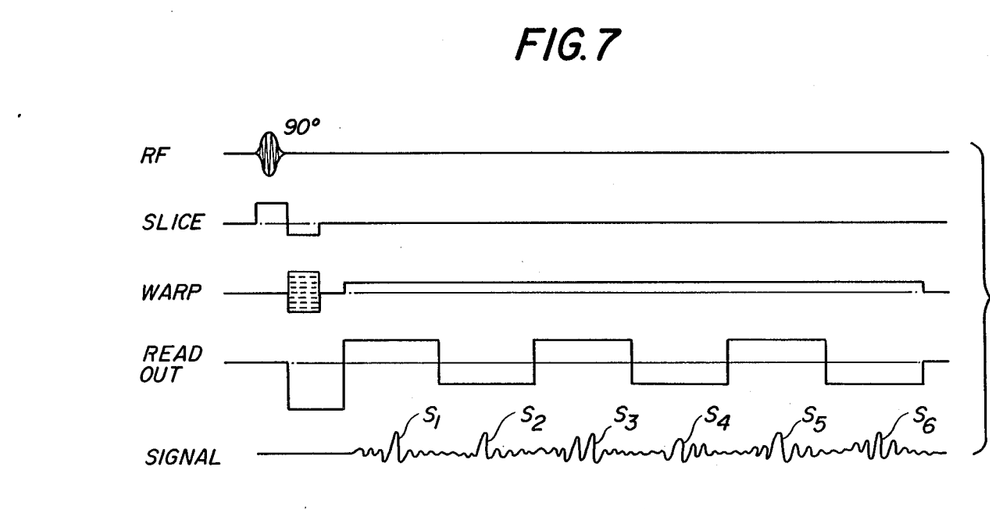
FIGS. 7 and 8 are diagrams for illustrating the operation of a further instrument according to the invention.
Figure 8:
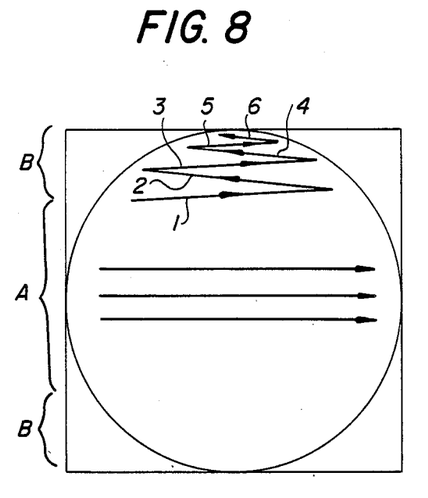

The present invention is not limited to the example described above. When the region B that needs a short data acquisition time is scanned, the sequence shown in FIG. 5 or FIG. 7 can be used. In the sequence shown in FIG. 5, spin echoes produced by inversion of reading gradients are used. After each of the spin echoes $S_2$ and $S_4$ is observed, an additional phase encoding is applied. In this example, data is collected in the order shown in FIG. 6. The sequence shown in FIG. 7 depends on inversion of the reading gradients, and is characterized in that a weak warp gradient is applied together with the reading gradients. The order in which data is collected is shown in FIG. 8. According to this scheme, data is sampled at quite close points. Also, when any of these sequences is used, the lengths of lines of data are adjusted according to the circular region by controlling the time for which reading gradients are applied.

The best mode for carrying out the invention has been described. It is to be understood that it is easy for those skilled in the art to make various amendments to it without departing from the scope of the invention which is delineated by the appended claims.

I claim:

1. A magnetic resonance imaging method of taking a tomogram of an object under examination by exciting the spins of the atomic nuclei existing in a desired cross section across the object placed in a uniform and static magnetic field with RF electromagnetic radiation, measuring the resulting NMR signal by Fourier transform, and reconstructing the tomogram from the signal, said method comprising the steps of:

defining a circular region whose center lies at the point in a two-dimensional Fourier plane at which the spatial frequency is zero, the Fourier plane corresponding to a region containing an image to be reconstructed;

observing the spin echo signals emanating from a region inside the circular region by using an exciting RF pulse followed by an inverse exciting RF pulse, and applying reading magnetic gradients; and observing the spin echo signals emanating from the remaining region inside the circular region while shortening the time for which a reading gradient magnetic field is applied whenever an excitation is effected and, at the same time, effecting an additional phase shift encoding.

2. The magnetic resonance imaging method of claim 1, wherein a plurality of 180° pulses are applied so that the spin echo signals are produced in said remaining region inside the circular region.

3. The magnetic resonance imaging method of claim 1, wherein a reading gradient magnetic field that is inverted a plurality of times is applied so that the spin echo signals are produced in said remaining region inside the circular region.

4. The magnetic resonance imaging method of claim 3, wherein the additional phase encoding is effected by application of a spin warp gradient magnetic field which is continuously produced while the spin echo signals are being observed.

* * * * *